US006500600B1

(12) United States Patent
Bernardini et al.

(10) Patent No.: US 6,500,600 B1
(45) Date of Patent: Dec. 31, 2002

(54) COMPOSITION SENSITIVE TO IR RADIATION AND TO HEAT AND LITHOGRAPHIC PLATE COATED WITH THIS COMPOSITION

(75) Inventors: Roberto Bernardini, Pianoro (IT); Domenico Tiefenthaler, Manerbio (IT); Angelo Bolli, Manerbio (IT)

(73) Assignee: Lastra S.p.A., Manerbio (IT)

( * ) Notice: Subject to any disclaimer, the term of this patent is extended or adjusted under 35 U.S.C. 154(b) by 48 days.

(21) Appl. No.: 09/628,361

(22) Filed: Jul. 28, 2000

(30) Foreign Application Priority Data

Jul. 30, 1999 (EP) .......................................... 99830489

(51) Int. Cl.$^7$ .............................................. G03F 7/004

(52) U.S. Cl. ............................... 430/285.1; 430/270.1; 430/944; 430/910; 430/964

(58) Field of Search ............................. 430/944, 270.1, 430/286.1, 285.1, 910, 945

(56) References Cited

U.S. PATENT DOCUMENTS 5,085,972 A 2/1992 Vogel ...................... 430/270.1
6,022,667 A * 2/2000 Vermeersch et al. ..... 430/271.1
6,051,361 A * 4/2000 Hattori et al. ........... 430/270.1
6,093,519 A * 7/2000 Rompuy et al. ............ 430/303
6,106,996 A * 8/2000 Van Damme et al. ... 430/271.1

FOREIGN PATENT DOCUMENTS

| | | | | |
|---|---|---|---|---|
| DE | 197 49 915 | | 5/1998 | |
| EP | 0766140-a1 | * | 4/1997 | ........... G03F/7/023 |
| EP | 0 823 327 | | 2/1998 | |
| EP | 0 901 902 | | 3/1999 | |
| WO | WO 97/39894 | | 10/1997 | |
| WO | WO 99/21725 | | 5/1999 | |

* cited by examiner

*Primary Examiner*—Cynthia Hamilton
(74) *Attorney, Agent, or Firm*—Oblon, Spivak, McClelland, Maier & Neustadt, P.C.

(57) ABSTRACT

A heat-sensitive composition of the positive type comprising a polymeric binder and a solubility inhibitor, wherein the said solubility inhibitor is a hydroxylated acrylic polymer, a hydroxylated acrylic copolymer or of a derivative thereof wherein some hydroxyl groups have been esterified by a carboxylic acid or a reactive derivative thereof.

31 Claims, No Drawings

COMPOSITION SENSITIVE TO IR RADIATION AND TO HEAT AND LITHOGRAPHIC PLATE COATED WITH THIS COMPOSITION

This application is based on European Patent Application No. 99830489.3 filed on Jul. 30, 1999, the content of which is incorporated hereinto by reference.

FIELD OF INVENTION

The present invention relates to a composition sensitive to IR radiation and to heat, and a lithographic plate coated with this composition.

In particular, it relates to a composition sensitive to IR radiation and to heat which is useful for the production of a lithographic plate of the positive type.

It also relates to a composition sensitive to laser radiation which is useful for the production of a lithographic plate of the positive type.

BACKGROUND OF INVENTION

As is well-known, the technique of printing by means of lithographic plates is based on differential partition between fatty substances and water. The fatty substance or ink is retained preferentially by the image area and the water is preferentially retained by the non-image area. When the surface of a lithographic plate, suitably prepared, is moistened with water and then sprinkled with ink, the non-image area retains the water and repels the ink, while the image area accepts the ink and repels the water. Then, the ink on the image area is transferred onto the surface of a material on which it is desired to reproduce the image, such as, for example, paper, textile and the like.

In general, the lithographic plates used in printing processes are formed from an aluminium support covered with a composition sensitive to light (photosensitive). When such a composition becomes soluble in an alkaline developing bath through the action of heat or of radiation of appropriate wavelength, the printing process is termed “positive”. Conversely, when the portion exposed to heat or to radiation of appropriate wavelength becomes insoluble in an alkaline developing bath, the printing process is termed “negative”. In both cases, the remaining, image area is lipophilic and hence accepts the ink, while the non-image area is hydrophilic and accepts the water.

The recent developments in the field of lithographic plates have been directed towards the search for compositions sensitive to laser light, preferably in the near IR. In particular, to laser light controlled by software, in such a way as directly to transfer the image created by computer onto the surface of the plate. This technique has the advantage of eliminating the photographic films, with consequent reduction in the pollution due to the chemical substances used for the preparation and production of these and elimination of all the problems that arise in the transfer of the image onto the plate via photographic films.

In the first place, a composition sensitive to radiation emitted by a laser could impart greater reliability to the system.

Secondly, it would be possible to work under ambient illumination, thus eliminating the automatic loading systems or the darkrooms.

With the aim of attaining this objective, in recent years many compositions comprising a polymeric binder and a solubility inhibitor have been investigated. Such a solubility inhibitor has the ability to render the polymeric binder insoluble in a suitable alkaline developing bath as long as it has not been exposed to a sufficient quantity of heat and of then rendering it soluble in the said developing bath after such exposure to heat. Besides the aforesaid components, many of the compositions described until now also comprise a so-called IR absorber, usually consisting of a compound capable of absorbing IR radiation and of transforming part of the radiation absorbed into heat, giving it up to the immediately surrounding environment.

OBJECTS OF INVENTION

The present invention aims to provide a composition sensitive to heat and a lithographic plate of the positive type coated with the said composition wherein the solubility inhibitor is a hydroxylated acrylic polymer, a hydroxylated acrylic copolymer or a derivative thereof.

The present invention also aims to provide a composition sensitive to IR radiation and a lithographic plate of the positive type coated with the said composition wherein the solubility inhibitor is a hydroxylated acrylic polymer, a hydroxylated acrylic copolymer or a derivative thereof.

The present invention also aims to provide a composition sensitive to laser radiation and a lithographic plate of the positive type coated with the said composition wherein the solubility inhibitor is a hydroxylated acrylic polymer, a hydroxylated acrylic copolymer or a derivative thereof.

Definitions

The term “lithographic plate” means a support covered with a coating which, after being suitably exposed and developed, is used, as a planographic matrix, in printing processes wherein there is differeritial partition between fatty substances and water.

Typical examples of support materials are constituted by plates of aluminium, zinc, copper, polyester and paper covered with a polymer. Preferably, the support is a sheet of grained aluminium, oxidized and suitably treated to receive the photosensitive composition.

The term “positive type” means that the portion of the photosensitive coating exposed to the radiation or to heat becomes soluble in such a way that it can be removed during the process of development of the plate. Typically, the development process is performed in alkalis having a conductivity pf from 75 to 110 mS.

The term “polymeric binder” means a polymer soluble in alkali, such as for example a novolac resin, a resol resin, a vinylphenolic resin, derivatives thereof or mixtures thereof.

Typically, a novolac resin is a polycondensation product obtained by reaction in an acidic environment between formaldehyde and phenol and/or m-cresol and/or symmetrical xylenol in a molecular ratio of less than 1 (for example formaldehyde:phenol=1:2). Optionally, the thus obtained compound is variously modified such as, for example, by reaction with amides.

Typical examples of commercial novolac resins are the products LB 6564 (mean ponderal molecular weight=6000–10,000) and LB 744 (mean ponderal molecular weight=8000–13,000) from the firm Bakelite (Germany), R 7100 (mean ponderal molecular weight=8000–10,000) from the firm Rohner, and PN 320 (mean ponderal molecular weight=3000–5000) and PN 430 (mean ponderal molecular weight=5000–9500) from the firm Clariant; 010/129/2 (mean ponderal molecular weight=8700–9700), 010/129/1 (mean ponderal molecular weight=2200–32 00), and 010/

127/1 (mean ponderal molecular weight=800–1800), 76/159 (mean ponderal molecular weight=2900–3900), 76/160 (mean ponderal molecular weight=2200–3200), 76/190 (mean ponderal molecular weight=7500–8500) from the firm Rohner.

The term "heat-sensitive composition" means a composition which includes a polymeric binder and has the property of being insoluble in an alkaline developing bath as long as it has not been exposed to a sufficient quantity of heat and of then being soluble in the said bath after such exposure to heat.

The term "solubility inhibitor" means a compound capable of rendering a heat-sensitive composition that contains it insoluble in a suitable alkaline developing bath as long as the said composition has not been exposed to a sufficient quantity of heat and/or laser radiation and of then rendering it soluble in the said developing bath after such exposure to heat and/or laser radiation.

The term "hydroxyl number" means the number of milligrams of KOH equivalent to the hydroxyl content of 1 gram of the compound under test. The determination is made by acetylating the compound under test with acetic anhydride in pyridine, hydrolysing with water the excess acetic anhydride that has not reacted and titrating the free acetic acid with KOH (phenolphthalein indicator).

The term "acidity number" means the number of milligrams of KOH necessary to neutralize the free acid present in 1 gram of the compound under test.

The term "IR absorber" means a compound capable of absorbing IR radiation and of transforming part of the absorbed radiation into heat and giving it up to the immediately surrounding environment. Preferably, such an absorber is soluble in water, ketones, glycols, glycolethers, alcohols, esters and mixtures thereof.

Typical examples of absorbers are the commercial products KF 646, KF 645, KF810, KF 1003, KF 1002, IR HBB 812 and KF 818 from the company Riedel-de Haen/Allied/Signal (Seelze, Germany), the commercial product ADS 830A and ADS 1060A, ADS793EI, ADS798MI, ADS798MP, ADS800AT, ADS805PI, ADS805PP, ADS805PA, ADS805PF, ADS812MI, ADS815EI, ADS818HI, ADS818HT, ADS822MT, ADS838MT, ADS840MT, ADS845BI, ADS905AM,ADS956BGI, ADS1040P, ADS1054P, ADS1050P, ADS1120P from the firm American Dye Source (Varennes, Quebec, Canada), the commercial products YKR-3070, YKR-3082, D99-029 and D99–039 from the firm Yamamoto Chemical Inc., the commercial product Projet 825 LDI from the firm Avecia Limited (ex Zeneca Specialties, Manchester, England). Here, for convenience, the product Projet 825 will be referred to hereinbelow by the abbreviation "Z".

A particularly interesting family of absorbers is that characterized by the following structural formula:

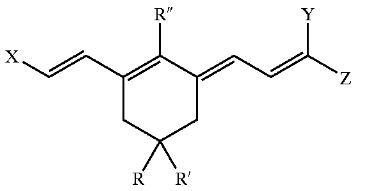

wherein X, Y, R, R' and R" can take many meanings. Typical examples of these meanings are: simple or condensed heterocyclic ring for X, simple or fused heterocyclic ring for Z and Y together with the carbon atom to which they are bound, hydrogen, $C_{1-3}$ alkyl, $SO_3^-$ or $COO^-$ for R and R' independently of one another and H or Cl for R".

Particular examples of the said heterocyclic rings are:

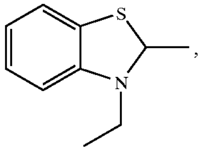,
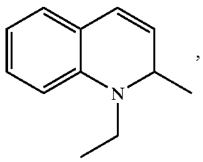,
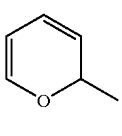,
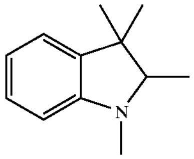
or
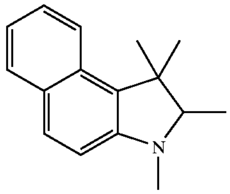

Specific examples of absorbers are:

A

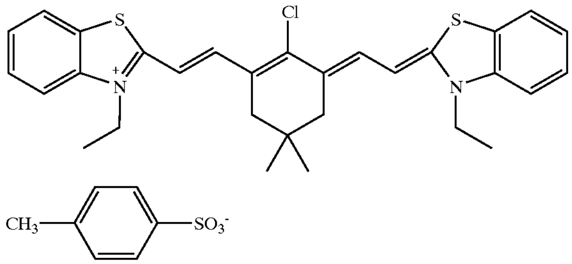

B

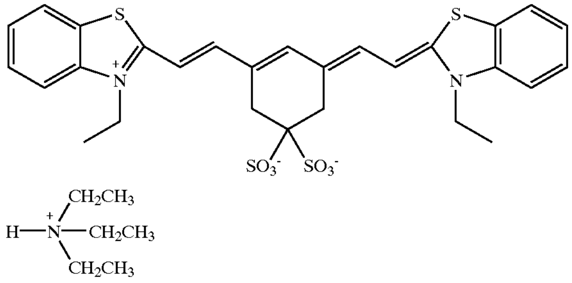

C

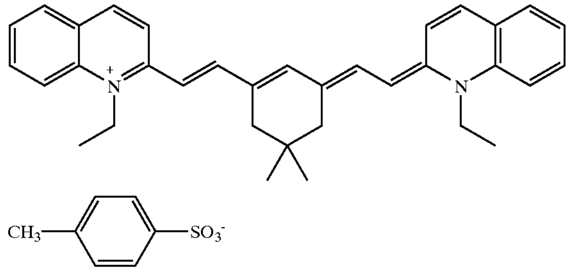

-continued

D

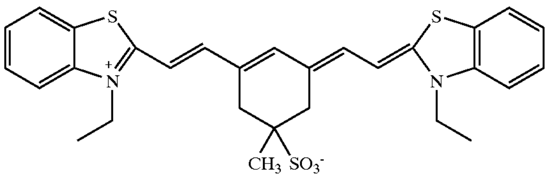

E

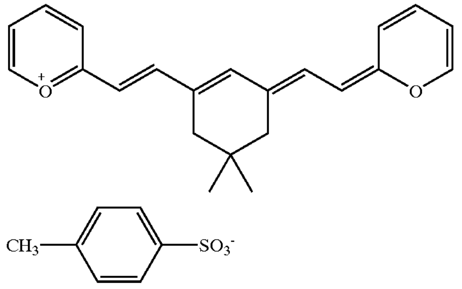

Z

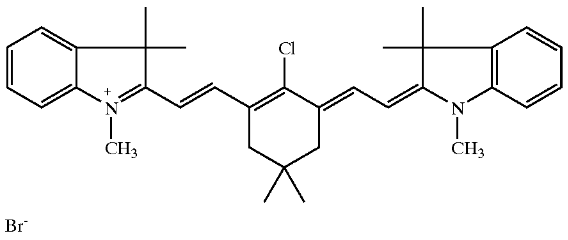

The term "IR radiation" means radiation of a wavelength of from of from 780 to 1400 nm.

A typical example of a device used to generate IR radiation is a laser diode which emits at ca. 830 nm.

The term "laser radiation" means radiation of a wavelength of from 600 to 1400 nm.

Absorber capable of absorbing radiation having a wavelenght of from 600 to 780 nm are well known in the art. Typical examples of such absorbers are the commercial products ADS640PP, AD640HI, ADS640HI, ADS675MT, ADS680BP, ADS740PP, ADS745HT, ADS760MP, ADS775MI, ADS775MP, ADS775HI, ADS775PI, ADS775PP, ADS780MT and ADS780BP from the firm American Dye Source (Varennes, Quebec, Canada).

The term "nominal wavelength" means a wavelength of from 805 to 830 nm.

The term "dye" means a coloured compound or preparation capable of dyeing the photosensitive composition in order to reveal the image after the exposure to light and/or after development.

Typical examples of dyes are Basonyl™ blue 636 (Colour Index 42595) from the firm Basf (Germany), Sudan Yellow 150 (Colour Index 11021) from the firm Basf (Germany), Solvent Green 3 (Colour Index 61565), Solvent Blue 59 (Colour Index 61552), Solvent Blue 35 (Colour Index 61554) or mixtures thereof.

The term "triazine" intends to mean the entire family of the substituted trichloromethyl-s-triazines of known type.

The term "additive" means a compound used to improve or confer a desired property on the photosensitive composition such as for example an enhancer developing agent, a pigment, a plasticizer capable of rendering the emulsion less resistant to heat and hence more sensitive, without however having an insolubilizing function, or an agent capable of modifying the surface and/or interfacial tension and thus improving the spreadability characteristics on the support and the covering power of the heat-sensitive composition.

Typical examples of pigments are: Heliogen™ Blue L 6700 F (PB 15:6 colour index 74160), Heliogen™ Blue L 6875 F (PB 15:2 colour index 74160) from the firm Basf (Germany), and from the Waxoline™ series: BLUE AP FW (colour index SB 36 PART 2 61551), VIOLET A FW (colour index SV 13 PART 2 60725), GREEN G FW (colour index SB 3 PART 2 61565) from the firm Avecia Limited (ex Zeneca Ltd.) or mixtures thereof.

Typical examples of agents capable of modifying the surface and/or interfacial tension are the copolymers dimethylpolysiloxane-modified polyethers, mixtures of high-boiling aromatic solvents, ketones and esters and fluorinated surfactants. Typical examples of such agents are the commercial products BYK 300, 302 and 341, BYKETOL™ OK from the firm BYK Mallinckrodt and FC 430 and FC 431 from the firm 3M.

SUMMARY OF INVENTION

In a first aspect thereof, the present invention relates to a heat-sensitive composition of the positive type comprising a polymeric binder and a solubility inhibitor, characterized in that the said solubility inhibitor is a hydroxylated acrylic polymer, a hydroxylated acrylic copolymer or a derivative thereof wherein some hydroxyl groups have been esterified with a carboxylic acid or a reactive derivative thereof.

In a second aspect thereof, the present invention also relates to a lithographic plate of the positive type coated with a heat-sensitive composition comprising a polymeric binder and a solubility inhibitor, characterized in that the said solubility inhibitor is a hydroxylated acrylic polymer, a hydroxylated acrylic copolymer or a derivative thereof wherein some hydroxyl groups have been esterified with a carboxylic acid or a reactive derivative thereof.

In a third aspect thereof, the present invention relates to a laser sensitive composition of the positive type comprising a polymeric binder and a solubility inhibitor, characterized in that the said solubility inhibitor is a hydroxylated acrylic polymer, a hydroxylated acrylic copolymer or a derivative thereof wherein some hydroxyl groups have been esterified with a carboxylic acid or a reactive derivative thereof.

In a further aspect thereof, the present invention also relates to a lithographic plate of the positive type coated with a laser composition comprising a polymeric binder and a solubility inhibitor, characterized in that the said solubility inhibitor is a hydroxylated acrylic polymer, a hydroxylated acrylic copolymer or a derivative thereof wherein some hydroxyl groups have been esterified with a carboxylic acid or a reactive derivative thereof.

Typically, the said hydroxylated acrylic copolymer has a hydroxyl number of from 40 to 200, preferably from 100 to 170.

Advantageously, the said hydroxylated acrylic copolymer has a mean ponderal molecular weight (MW) of from 3000 to 30,000 atomic mass units (a.m.u.) and, preferably, from 6000 to 20,000 a.m.u. and has a polydispersity index (MW/Mn) of from 1.5 to 6.

Typical examples of suitable hydroxylated acrylic copolymers are the Macrynal™ resins from Hoechst, such as, for example, Macrynal™ SM 510 N (hydroxyl number: 135–155), SM 513, (hydroxyl number: 110–130), SM 515 (hydroxyl number: 145–160) and SM 516 (hydroxyl number: 130–150).

Typical examples of suitable carboxylic acids are the aliphatic and aromatic mono- and polycarboxylic acids.

Advantageously, the acid is a dicarboxylic acid selected from the group consisting of maleic, fumaric, malonic and phthalic acid.

Typical examples of reactive derivatives of aliphatic carboxylic acids are those selected from the group consisting of acid chloride and anhydride.

Advantageously, the hydroxylated polymer according to the present invention is modified by partial esterification with maleic anhydride.

Preferably, the said partial esterification is performed using from 10 to 90% of the stoichiometric quantity of the reactive aliphatic carboxylic acid derivative required to esterify all the hydroxyl groups of the hydroxylated polymer. More preferably from 20 to 60%, still more preferably from 20 to 30%.

The said esterification reaction of some hydroxyl groups of a hydroxylated polymer with an aliphatic carboxylic acid or a reactive derivative thereof is readily performed by standard techniques well known to the specialist in the field.

Preferably, the said polymeric binder comprises a novolac resin having a mean ponderal molecular weight of from 2000 to 14,000.

Advantageously, the said polymeric binder consists of a mixture of two or more novolacs. Preferably, a first novolac has a mean ponderal molecular weight of from 3000 to 5000 and a second novolac has a mean ponderal molecular weight of from 6000 to 10,000.

In a preferred embodiment of the present invention, the composition also comprises an IR absorber capable of absorbing IR radiation of from 780 to 1400 nm, preferably from 780 to 1100 nm, and of converting it into heat.

The composition of the present invention can also comprise a dye.

Typically the said dye is Basonyl blue 636 (Colour Index 42595) and is present in quantities sufficient only to dye the composition.

The composition of the present invention can also comprise a plasticizer, a triazine and other additives of a standard nature. In particular, the plasticizer has the purpose of modifying the toughness and the hardness of the said composition by varying its sensitivity to heat without appreciably affecting its sensitivity to the developers.

Advantageously, the composition of the present invention can also contain solubility inhibitors belonging to other classes such as, for example, organometallic compounds and organic salts of metals which are the subject of another patent application, which is included here by reference, filed on the same date by the Applicant. Typically, the said compositions are organic derivatives of titanium. A typical example of such compounds is triethanolaminated titanium isopropoxide, also known as Tyzor™ TE.

The present invention is further described by the following Examples and Tests, which are solely for illustrative purposes and must not be considered to limit the invention.

Experiments

EXAMPLE 1

Partial Esterification of a Hydroxylated Polymer

Reagents

| | |
|---|---|
| Macrynal ™ SM 510N | 32.0 kg (75.24% w/w) |
| Maleic anhydride | 2.4 kg (5.64% w/w) |
| Hydroquinone | 22.5 g (0.053% w/w) |
| Triethylamine | 108 g (0.25% w/w) |
| Butyl acetate | 8.0 kg (18.81% w/w) |

Method

The Macrynal™ SM 510 N, having an OH number of ca. 160, and the hydroquinone was placed in 50 l a top-loading glass reactor, equipped with a mechanical stirrer of 0.45–0.5 kW power with rotating teflon paddle, a 3 liter dropping funnel and a reflux condenser. This reactor was also equipped with a heating mantle with double thermocouple control: one placed at the base of the reactor and the other at the top of the heating mantle.

When the addition was complete, the stirrer and the resistors were switched on, setting the heating effect of the first to 78° C. and that of the second to 80° C.

The maleic anhydride was dissolved separately in half of the volume of butyl acetate with heating (50° C.) and stirring, prolonged contact with the air being avoided so as to avoid the moisture contained therein transforming the anhydride to the acid.

When the reactor temperature reached 80° C., the maleic anhydride solution was added over a period of 15 minutes.

The container that had contained the maleic anhydride solution was washed with a portion of the remaining butyl acetate.

Separately, a solution containing the triethylamine and the remaining butyl acetate was prepared, and it was added slowly to the reaction mixture over a period of ca. 1 hour.

When the addition was complete, the temperature of the first resistor was reset to 88° C. and that of the second resistor to 90° C.

The reaction mixture was allowed to react for 5 hours at 90° C. Then the heating resistors were switched off and the reaction mixture was allowed to cool with stirring.

The product thus obtained could be used as such to prepare the heat-sensitive composition of the present invention and was mainly composed of the desired esterification product (50–60% w/w) and of butyl acetate (40–50% w/w).

The desired esterification product had the following characteristics:

Acidity No. 75±10 mg KOH/g

Viscosity (with cup No.3*) 200"

(*) The viscosity was measured by the FORD cup method at 25° C.

EXAMPLE 2

Preparation of Compositions Sensitive to Heat and to IR Radiation

The mixture (6 g) of the components indicated in the following Tables was dissolved at ambient temperature (ca. 25° C.) in 94 9 of a 30:70 (w/w) acetone:methoxypropanol mixture, stirring until complete dissolution of the components.

The solution obtained was filtered through paper using a filter of the 0860 type from the firm Schleicher & Schuell (100 mm).

TABLE 1

| Composition No. | 1 | 2 | 3 |
|---|---|---|---|
| Component | % (w/w) | % (w/w) | % (w/w) |
| R7100 | 46.9 | 53.9 | 60.9 |
| PN 320 | 20.1 | 23.1 | 26.1 |
| Macrynal ™ SM 510N | 30 | 20 | 10 |
| "Z" | 3 | 3 | 3 |

TABLE 2

| Composition No. | 4 | 5 | 6 |
|---|---|---|---|
| Component | % (w/w) | % (w/w) | % (w/w) |
| R7100 | 46.9 | 53.9 | 60.9 |
| PN 320 | 20.1 | 23.1 | 26.1 |
| Polymer of Example 1 | 30 | 20 | 10 |
| "Z" | 3 | 3 | 3 |

TABLE 3

| Composition No. | 7 | 8 | 9 |
|---|---|---|---|
| Component | % (w/w) | % (w/w) | % (w/w) |
| R7100 | 39.9 | 46.9 | 53.9 |
| PN 320 | 17.1 | 20.1 | 23.1 |
| Macrynal ™ SM 510N | 10 | 10 | 10 |
| Tyzor ™ TE (*) | 30 | 20 | 10 |
| "Z" | 3 | 3 | 3 |

*triethanolaminated titanium isopropoxide

TABLE 4

| Composition No. | 10 | 11 | 12 | 13 |
|---|---|---|---|---|
| Component | % (w/w) | % (w/w) | % (w/w) | % (w/w) |
| R7100 | 39.9 | 46.9 | 53.9 | 0 |
| PN 320 | 17.1 | 20.1 | 23.1 | 0 |
| Polymer of Example 1 | 10 | 10 | 10 | 0 |
| Macrynal ™ SM 510N | 0 | 0 | 0 | 10 |
| Rohner 10/129/2 | 0 | 0 | 0 | 87 |
| Tyzor ™ TE | 30 | 20 | 10 | 0 |
| "Z" | 3 | 3 | 3 | 3 |

TABLE 5

| Composition No. | 14 | 15 | 16 | 17 |
|---|---|---|---|---|
| Component | % (w/w) | % (w/w) | % (w/w) | % (w/w) |
| R7100 | 56.7 | 56.7 | 56.7 | 56.7 |
| PN 320 | 24.3 | 24.3 | 24.3 | 24.3 |
| Macrynal ™ SM 513N | 0 | 0 | 15 | 0 |
| Macrynal ™ SM 515N | 0 | 15 | 0 | 0 |
| Macrynal ™ SM 516N | 15 | 0 | 0 | 15 |
| Basonyl 636 | 1 | 1 | 1 | 1 |
| "Z" | 3 | 3 | 3 | 0 |
| ADS 1060 | 0 | 0 | 0 | 3 |

The above mixtures of Tables 1–5 are completely soluble also in the following solvents: methylketone [MEK]; acetone/MEK (5/95 to 95/5 w/w); MEKI2-methoxyisopropanol (5/95 to 95/5 w/w); acetone/isopropylalcohol [IPA] (5/95 to 95/5 w/w); MEK/IPA (5/95 to 95/5 w/w).

EXAMPLE 3

Preparation of a Lithographic Plate of the Positive Type

The compositions of the previous Example 2 were spread on an aluminium support which had previously been treated by standard techniques. The plate thus coated was dried in a forced circulation oven such as the PID system M80-VF from the firm MPM Instruments s.r.l. (of Bernareggio, Milan, Italy) at 90° C. for 8 minutes. The weight of the photosensitive coating is 1.6–2.2 g/cm$^2$.

After being allowed to stand for at least 24 hours, the plates thus obtained were subjected to the following Tests.

Test 1

Resistance to a 10% Solution of Sodium Metasilicate Pentahydrate in Demineralized Water A 2×30 cm strip of plate was immersed in successive "steps" of 4 cm/10 sec in a graduated cylinder containing the 10% sodium metasilicate pentahydrate solution at the temperature of 24° C.

In this way, a scale made up of six zones with immersion times of 10 secs for the 1$^{st}$ step of the scale up to one minute for the last was obtained. The results are shown in Table 6 below.

TABLE 6

| | Steps | | | | | |
|---|---|---|---|---|---|---|
| Composition | 1 | 2 | 3 | 4 | 5 | 6 |
| 1 | | | | | | X |
| 2 | | | X | | | |
| 3 | X | | | | | |
| 4 | | | | | X | |
| 5 | | X | | | | |
| 6 | X | | | | | |
| 7 | X | | | | | |
| 8 | X | | | | | |
| 9 | X | | | | | |
| 10 | X | | | | | |
| 11 | X | | | | | |
| 12 | X | | | | | |
| 13 | | | X | | | |
| 14 | X | | | | | |
| 15 | X | | | | | |
| 16 | X | | | | | |
| 17 | X | | | | | |

The values indicate the first step visible independently of the thickness of the remaining coating; the value 1 is equivalent to a time of 10 seconds and the value 6 is equivalent to a time of 60 seconds. The resistance of the composition to the solution used is highest for the value 6 and lowest or zero resistance for the value 1.

Test 2

Resistance to the Developer LAP98

A 2×30 cm strip of plate was immersed in successive "steps" of 4 cm/10 sec in a graduated cylinder containing a solution of LAP98 at the temperature of 24° C.

The LAP98 had the following composition: water (85% w/w), sodium metasilicate pentahydrate (13% w/w), surfactants (0.5% w/w) and other additives (1.5% w/w).

In this way, a scale made up of six zones with immersion times of 10 secs for the $1^{st}$ step of the scale up to one minute for the last was obtained. The results are shown in Table 7 below.

TABLE 7

| | Steps | | | | | |
|---|---|---|---|---|---|---|
| Composition | 1 | 2 | 3 | 4 | 5 | 6 |
| 1 | | | | | | X |
| 2 | | | | | X | |
| 3 | | | | | X | |
| 4 | | | | | | X |
| 5 | | | | X | | |
| 6 | | X | | | | |
| 7 | | | | | | X |
| 8 | | | | | X | |
| 9 | | X | | | | |
| 10 | | | | | | X |
| 11 | | | | | X | |
| 12 | X | | | | | |
| 13 | | | | | | X |
| 14 | | X | | | | |
| 15 | | X | | | | |
| 16 | X | | | | | |
| 17 | | X | | | | |

The values indicate the first step visible independently of the thickness of the remaining coating; the value 1 is equivalent to a time of 10 seconds and the value 6 is equivalent to a time of 60 seconds. The resistance of the composition to the solution used is highest for the value 6 and lowest or zero resistance for the value 1.

Test 3

Resistance to Isopropyl Alcohol

A 2×30 cm strip of plate was immersed in successive “steps” of 4 cm/10 sec in a graduated cylinder containing a 40% aqueous solution of isopropyl alcohol at a temperature of 24° C.

In this way, a scale made up of six zones with immersion times of 1 minute for the $1^{st}$ step of the scale up to 6 minutes for the last was obtained. After the immersion, onto the surface of each strip was applied an adhesive band, which was immediately removed by pulling, in order to evaluate the degree of deterioration of photosensitive layer caused by the solution of isopropyl alcohol. The results are shown in Table 8 below.

TABLE 8

| | Steps | | | | | |
|---|---|---|---|---|---|---|
| Composition | 1 | 2 | 3 | 4 | 5 | 6 |
| 1 | X | | | | | |
| 2 | X | X | | | | |
| 3 | | X | | | | |
| 4 | X | | | | | |
| 5 | X | X | | | | |
| 6 | | X | | | | |
| 7 | | | | | X | |
| 8 | | X | | | | |
| 9 | X | | | | | |
| 10 | | | | | X | |
| 11 | | X | | | | |
| 12 | X | | | | | |
| 13 | | | | | | X |
| 14 | | X | | | | |
| 15 | X | | | | | |

TABLE 8-continued

| | Steps | | | | | |
|---|---|---|---|---|---|---|
| Composition | 1 | 2 | 3 | 4 | 5 | 6 |
| 16 | X | | | | | |
| 17 | | X | | | | |

The values indicate the first step visible independently of the thickness of the remaining coating; the value 1 is equivalent to a time of 1 minute and the value 6 is equivalent to a time of 6 minutes. The resistance of the composition to the solution used is highest for the value 6 and lowest or zero resistance for the value 1.

Test 4

Exposure to IR Radiation

Six different zones of a plate having the same weight distribution per unit area were exposed using a laser beam, controlled by software and having a nominal wavelength 830 nm (all composition except for compostion No. 17) and nominal wavelength 1060 nm (composition No. 17 only), at the following energy values/cm$^2$; 300 mJ/cm$^2$, 250 mJ/cm$^2$, 150 mJ/cm$^2$, 100 mJ/cm$^2$, 75 mJ/cm$^2$ and 50 mJ/cm$^2$.

The exposed plates were immediately developed in a tray using, as reference, LAP98 from the firm Lastra S.p.A. as developer at a temperature of from 24 to 25° C. for 45 seconds of immersion time with stirring plus 15 seconds of wiping with a cotton pad.

The results of the test are shown in Table 9 and 9bis.

TABLE 9

| | Cleanness of the Base | | | | | |
|---|---|---|---|---|---|---|
| Composition | A 300 mJ/cm$^2$ | B 300 mJ/cm$^2$ | A 250 mJ/cm$^2$ | B 250 mJ/cm$^2$ | A 150 mJ/cm$^2$ | B 150 mJ/cm$^2$ |
| 1 | yes | yes | no | no | no | no |
| 2 | yes | yes | yes | yes | yes | yes |
| 3 | yes | yes | yes | yes | yes | yes |
| 4 | yes | yes | yes | no | no | no |
| 5 | yes | yes | yes | yes | yes | yes |
| 6 | yes | yes | yes | yes | yes | yes |
| 7 | yes | yes | yes | yes | no | no |
| 8 | yes | yes | yes | yes | yes | no |
| 9 | yes | yes | yes | yes | yes | yes |
| 10 | yes | yes | yes | yes | yes | no |
| 11 | yes | yes | yes | yes | yes | yes |
| 12 | yes | yes | yes | yes | yes | yes |
| 13 | yes | yes | no | no | no | no |
| 14 | yes | yes | yes | yes | yes | yes |
| 15 | yes | yes | yes | yes | yes | yes |
| 16 | yes | yes | yes | yes | yes | yes |
| 17 | yes | yes | yes | yes | yes | yes |

| | Cleanness of the Base | | | | | |
|---|---|---|---|---|---|---|
| Composition | A 100 mJ/cm$^2$ | B 100 mJ/cm$^2$ | A 75 mJ/cm$^2$ | B 75 mJ/cm$^2$ | A 50 mJ/cm$^2$ | B 50 mJ/cm$^2$ |
| 1 | no | no | no | no | no | no |
| 2 | yes | yes | no | no | no | no |
| 3 | yes | yes | yes | yes | yes | yes |
| 4 | no | no | no | no | no | no |
| 5 | yes | yes | no | no | no | no |
| 6 | yes | yes | yes | yes | yes | yes |
| 7 | no | no | no | no | no | no |

TABLE 9-continued

| | | | | | | |
|---|---|---|---|---|---|---|
| 8 | no | no | no | no | no | no |
| 9 | yes | no | no | no | no | no |
| 10 | no | no | no | no | no | no |
| 11 | no | no | no | no | no | no |
| 12 | yes | yes | yes | yes | no | no |
| 13 | no | no | no | no | no | no |
| 14 | yes | yes | yes | yes | no | no |
| 15 | yes | yes | yes | yes | no | no |
| 16 | yes | yes | yes | yes | no | no |
| 17 | yes | yes | yes | yes | no | no |

A corresponds to an emulsion weight of 1.6–1.8 g/m$^2$.
B corresponds to an emulsion weight of 2.0–2.2 g/m$^2$.

The term "cleanness of the base" is used to mean that the developer has removed the composition from the regions that have been exposed to laser radiations.

Test 5

Resistance to Mechanical Abrasion

To simulate the mechanical and chemical abrasion which a plate undergoes during the printing cycle, samples of plates corresponding to the compositions from 1 to 4, 13–16 were fixed to a level surface and placed in close contact with a cotton pad soaked in a 50% solution of isopropyl alcohol. The pad was moved by an arm attached to a compressed air system capable of imparting an oscillatory motion with consequent rubbing of the samples under examination. For each composition, the maximum number of passes before the complete removal of the emulsion was recorded. The results expressed in number of passes are reproduced in the following Table 10.

TABLE 10

| composition | Number of Passes |
|---|---|
| 1 | 10 |
| 2 | 15 |
| 3 | 30 |
| 4 | 10 |
| 13 | 180 |
| 14 | 30 |
| 15 | 10 |
| 16 | 10 |

What is claimed is:

1. A heat-sensitive composition of the positive type comprising a polymeric binder and a solubility inhibitor, wherein said solubility inhibitor is a derivative of a hydroxylated acrylic polymer or copolymer wherein some hydroxy groups have been esterified with a carboxylic acid or a reactive derivative thereof.

2. A composition according to claim 1, wherein said hydroxylated acrylic polymer or copolymer has a hydroxyl number of from 40 to 200.

3. A composition according to claim 2, wherein said hydroxylated acrylic polymer or copolymer has a hydroxyl number of from 100 to 170.

4. A composition according to claim 1, wherein said hydroxylated acrylic polymer or copolymer has a mean molecular weight (MW) of from 3000 to 30,000 a.m.u.

5. A composition according to claim 4, wherein said hydroxylated acrylic polymer or copolymer has a mean ponderal molecular weight (MW) of from 6000 to 20,000 a.m.u.

6. A composition according to claim 1, wherein said acid is a dicarboxylic acid.

7. A composition according to claim 6, wherein said dicarboxylic acid is selected from the group consisting of maleic, fumaric, malonic and phthalic acid.

8. A composition according to claim 1, wherein said reactive derivative of an aliphatic carboxylic acid is selected from the group consisting of acid chloride and anhydride.

9. A composition according to claim 8, wherein said reactive derivative of an aliphatic carboxylic acid is maleic anhydride.

10. A composition according to claim 1, wherein said polymeric binder comprises a novolac resin having a mean ponderal molecular weight of from 2000 to 14,000.

11. A composition according to claim 1, further comprising an IR absorber capable of absorbing IR radiation of from 780 to 1400 nm.

12. A composition according to claim 1, further comprising a solubility inhibitor which is an organic derivative of titanium.

13. A laser sensitive composition of the positive type comprising a polymeric binder and a solubility inhibitor, wherein said solubility inhibitor is a derivative of a hydroxylated acrylic polymer or copolymer wherein some hydroxy groups have been esterified with a carboxylic acid or a reactive derivative thereof.

14. A lithographic plate of the positive type coated with a heat-sensitive composition comprising a polymeric binder and a solubility inhibitor, wherein said solubility inhibitor is a derivative of a hydroxylated acrylic polymer or copolymer wherein some hydroxy groups have been esterified with a carboxylic acid or a reactive derivative thereof.

15. A lithographic plate according to claim 14, wherein said hydroxylated acrylic polymer or copolymer has a hydroxyl number of from 40 to 200.

16. A lithographic plate according to claim 15, wherein said hydroxylated acrylic polymer or copolymer has a hydroxyl number of from 100 to 170.

17. A lithographic plate according to claim 14, wherein said hydroxylated acrylic polymer or copolymer has a mean molecular weight (MW) of from 3000 to 30,000 a.m.u.

18. A lithographic plate according to claim 17, wherein said hydroxylated acrylic polymer or copolymer has a mean ponderal molecular weight (MW) of from 6000 to 20,000 a.m.u.

19. A lithographic plate according to claim 14, wherein said acid is a dicarboxylic acid.

20. A lithographic plate according to claim 19, wherein said dicarboxylic acid is selected from the group consisting of maleic, fumaric, malonic and phthalic acid.

21. A lithographic plate according to claim 14, wherein said reactive derivative of an aliphatic carboxylic acid is selected from the group consisting of acid chloride and anhydride.

22. A lithographic plate according to claim 21, wherein said reactive derivative of an aliphatic carboxylic acid is maleic anhydride.

23. A lithographic plate according to claim 14, wherein said polymeric binder comprises a novolac resin having a mean ponderal molecular weight of from 2000 to 14,000.

24. A lithographic plate according to claim 14, further comprising an IR absorber capable of absorbing IR radiation of from 780 to 1400 nm.

25. A lithographic plate according to claim 14, further comprising a solubility inhibitor which is an organic derivative of titanium.

26. A composition according to claim 1, wherein the hydroxylated acrylic polymer or copolymer is esterified with from 10 to 90% of the stochiometric quantity required to esterify all of the hydroxy groups of the hydroxylated acrylic polymer or copolymer.

27. A composition according to claim 1, wherein the hydroxylated acrylic polymer or copolymer is esterified with from 20 to 60% of the stochiometric quantity required to esterify all of the hydroxy groups of the hydroxylated acrylic polymer or copolymer.

28. A composition according to claim 1, wherein the hydroxylated acrylic polymer or copolymer is esterified with from 20 to 30% of the stochiometric quantity required to esterify all of the hydroxy groups of the hydroxylated acrylic polymer or copolymer.

29. A lithographic plate according to claim 14, wherein the hydroxylated acrylic polymer or copolymer is esterified with from 10 to 90% of the stochiometric quantity required to esterify all of the hydroxy groups of the hydroxylated acrylic polymer or copolymer.

30. A lithographic plate according to claim 27, wherein the hydroxylated acrylic polymer or copolymer is esterified with from 10 to 90% of the stochiometric quantity required to esterify all of the hydroxy groups of the hydroxylated acrylic polymer or copolymer.

31. A lithographic plate according to claim 28, wherein the hydroxylated acrylic polymer or copolymer is esterified with from 10 to 90% of the stochiometric quantity required to esterify all of the hydroxy groups of the hydroxylated acrylic polymer or copolymer.

* * * * *